(12) United States Patent
Katz et al.

(10) Patent No.: US 8,236,133 B2
(45) Date of Patent: Aug. 7, 2012

(54) PLASMA REACTOR WITH CENTER-FED MULTIPLE ZONE GAS DISTRIBUTION FOR IMPROVED UNIFORMITY OF CRITICAL DIMENSION BIAS

(75) Inventors: Dan Katz, San Jose, CA (US); David Palagashvili, Mountain View, CA (US); Brian K. Hatcher, San Jose, CA (US); Theodoros Panagopoulos, San Jose, CA (US); Valentin N. Todorow, Palo Alto, CA (US); Edward P. Hammond, IV, Hillsborough, CA (US); Alexander M. Paterson, San Jose, CA (US); Rodolfo P. Belen, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1083 days.

(21) Appl. No.: 12/143,092

(22) Filed: Jun. 20, 2008

(65) Prior Publication Data

US 2009/0272492 A1 Nov. 5, 2009

Related U.S. Application Data

(60) Provisional application No. 61/126,600, filed on May 5, 2008.

(51) Int. Cl.
*H01L 21/311* (2006.01)

(52) U.S. Cl. ............. 156/345.33; 156/345.34; 118/715; 438/714; 257/E21.214

(58) Field of Classification Search ............. 156/345.33, 156/345.34; 118/715; 438/714; 257/E21.214
See application file for complete search history.

(56) References Cited

U.S. PATENT DOCUMENTS 8,066,895 B2 11/2011 Belen et al.
2002/0041160 A1 4/2002 Barnes et al.

OTHER PUBLICATIONS

Official Action Dated May 25, 2012 Issued in Co-pending U.S. Appl. No. 12/143,146.
U.S. Appl. No. 12/143,146, filed Jun. 20, 2008, Katz et al.

*Primary Examiner* — Ram Kackar
*Assistant Examiner* — Satish Chandra
(74) *Attorney, Agent, or Firm* — Robert M. Wallace

(57) ABSTRACT

A gas distribution assembly for the ceiling of a plasma reactor includes a center fed hub and an equal path length distribution gas manifold underlying the center fed hub.

9 Claims, 13 Drawing Sheets

PLASMA REACTOR WITH CENTER-FED MULTIPLE ZONE GAS DISTRIBUTION FOR IMPROVED UNIFORMITY OF CRITICAL DIMENSION BIAS

CROSS-REFERENCE TO REALATED APPLICATIONS

This application claims the benefit of U.S. Provisional Application Ser. No. 61/126,600, filed May 5, 2008.

BACKGROUND

In plasma processing of semiconductor wafers, precise feature profile control has become increasingly important during gate etching as the critical dimensions of semiconductor devices continue to scale down below 45 nm. For example, the integrity and critical dimension (CD) control of the hardmask during gate mask definition is critical in gate etch applications. For example, for a polysilicon gate, the hardmask layer overlying the polysilicon layer can be silicon nitride. For etching of the silicon nitride hardmask layer, the CD of greatest criticality is the mask length at the bottom of the hardmask. Likewise, for etching of the polysilicon gate, the CD of greatest criticality is the gate length at the bottom of the polysilicon gate. This length typically defines the all-important channel length of the transistor during later process steps. Therefore, during definition (etching) of the hardmask or of the polysilicon gate, it is important to minimize discrepancy between the required CD and the CD obtained at the end of the etch step. It is also important to minimize the variation in the CD bias, the difference between the CD as defined by the mask and the final CD after the etch process. Finally, it is important to minimize the CD bias microloading, which is the difference between the CD bias in regions in which the discrete circuit features are dense or closely spaced and the CD bias in regions in which the discrete circuit features are isolated or widely spaced apart.

Various conventional techniques have been used to meet these requirements. For instance, trial-and-error techniques have been used for determining the optimum gas flow rates for the various gas species in the reactor, the optimum ion energy (determined mainly by RF bias power on the wafer) and the optimum ion density (determined mainly by RF source power on the coil antenna). The foregoing process parameters affect not only CD, CD bias and CD bias microloading but also affect other performance parameters, such as etch rate and etch rate uniformity. It may not be possible to set the process parameters to meet the required performance parameters such as etch rate and at the same time optimize CD and minimize CD bias and CD bias microloading. As a result, the process window, e.g., the allowable ranges of process parameters such as chamber pressure, gas flow rates, ion energy and ion density, may be unduly narrow to satisfy all requirements.

A current problem is that CD bias is non-uniform, decreasing near the wafer edge. This problem is becoming more acute as device feature sizes are scaled down to 32 nm and smaller. Part of this problem is the sharp drop in CD bias at the wafer edge. We believe that this sharp drop is due to the lack of etch passivation species to passivate etch by-products. The amount of passivation species affects etch profile tapering and sidewall etch rate in high aspect ratio openings. Typically, the greater the amount of passivation gas present, the greater the etch profile tapering. What is desired is the etch profile or etch profile tapering be uniform across the wafer. This will promote a uniform distribution of CD bias. Because of the lack of passivation gas at the wafer edge, the etch profile taper is small at the wafer edge and large elsewhere.

SUMMARY

A ceiling gas distribution assembly is provided for use in a plasma reactor for processing a semiconductor substrate. The assembly includes a planar gas injection orifice plate including concentric inner, intermediate and outer annular zones of gas injection orifices. A central gas receiving hub overlies the orifice plate, the hub including three gas supply ports and having a hub bottom surface and three concentric hub channels formed in the hub bottom surface and internally coupled to respective ones of the three gas supply ports. A translation gas manifold underlies the hub and includes three sets of internal gas flow channels associated with the inner, intermediate and outer zones, respectively, each of the internal gas flow channels including: (a) a gas input opening at a top surface of the translation gas manifold in registration with a respective one of the concentric hub channels and (b) a gas output opening at a bottom surface of the translation gas manifold at a radius corresponding to a respective one of the inner, intermediate and outer zones. The assembly further includes an equal path length (EPL) manifold between the translation gas manifold and the orifice plate and providing gas flow paths of equal path lengths from the gas output openings of individual ones of the zones to the gas injection orifices of the same zones.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

Figure 1:
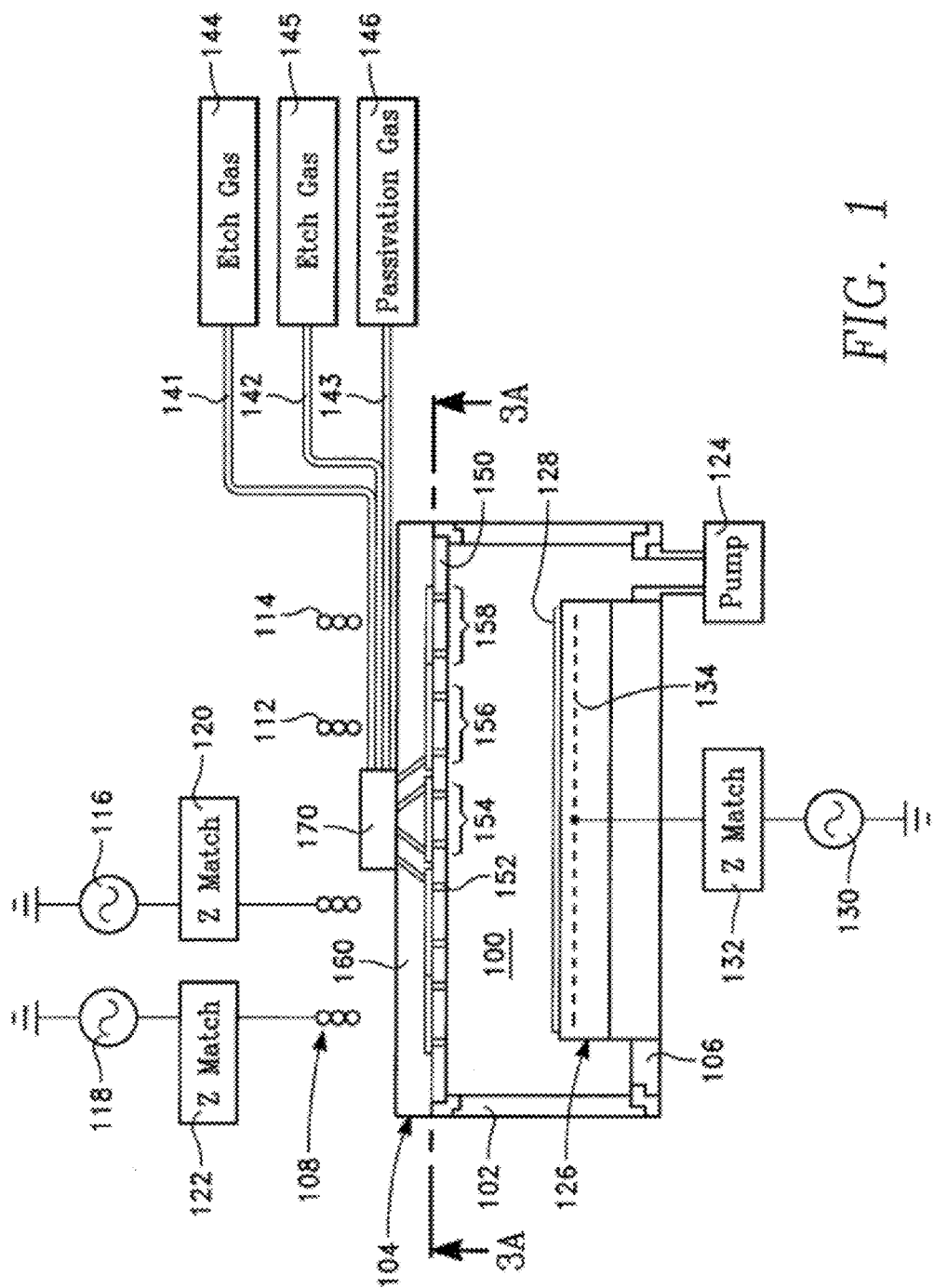
FIG. 1 depicts a plasma reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 depicts a plasma reactor for processing a workpiece or semiconductor wafer in accordance with a first embodiment. The reactor has a chamber 100 defined by a cylindrical sidewall 102, a ceiling 104 and a floor 106. An RF plasma source power applicator 108 is provided and may be an inductive coil antenna overlying the ceiling 104. The coil antenna 108 may consist of an inner coil 112 and an outer coil 114 surrounding the inner coil. RF power to each of the coils 112, 114 may be independently controllable and may be furnished from a common power generator or (as depicted in FIG. 1) from separate RF power generators 116, 118 coupled to the respective coils 112, 114 through respective impedance matches 120, 122. The chamber is evacuated by a vacuum pump 124 through the floor 106. A wafer support pedestal 126 supported at the floor 106 holds a workpiece 128 such as a semiconductor wafer. An RF plasma bias power generator 130 (or plural RF bias power generators of different frequencies) may be coupled through an impedance match 132 (or plural respective impedance matches) to an electrode 134 within the pedestal 126.

In embodiments described below, the gas distribution apparatus within the ceiling 104 may distribute process gases in three gas distribution zones that receive process gas from three independent gas supply lines 141, 142, 143. These three zones are, in one embodiment, annular concentric zones including inner, middle and outer zones. The gas mixtures and flow rates in each of the lines 141, 142, 143 may be independently controlled. For example, each line 141, 142, 143 may be supplied with process gas from a respective gas source 144, 145, 146. As will be described below, the gas supply lines 141, 142, 143 supply process gas for injection in respective inner, middle and outer gas injection zones below the ceiling. The gas furnished by the gas supplies 144 and 145 to the inner and middle gas injection zones is, in one embodiment, a mixture of an etch species precursor gas and a passivation species precursor gas, and etch rate distribution across the wafer may be controlled by the ratio of the flow rates from the gas supplies 144, 145. Gas furnished by the gas supply 146 to the outer gas injection zone may be a pure or nearly pure passivation species precursor gas, and radial distribution of CD bias or etch profile taper may be controlled by varying the gas flow rate from the gas supply 146. This latter adjustment is independent or nearly independent of the adjustment of the etch rate distribution. Typically, the CD bias distribution is non-uniform because it decreases near the wafer edge, and uniformity is achieved by increasing the passivation species precursor gas flow rate to the outer gas injection zone. In this way, two etch performance parameters, namely (a) distribution of etch rate and (b) distribution of CD bias, are controlled simultaneously and nearly independently of one another in the reactor of FIG. 1.

The ceiling 104 in one embodiment includes a showerhead orifice plate 150 having an array of gas injection orifices 152 extending through it. In the illustrated embodiment of FIG. 2A, the orifices 152 are located in three concentric radial zones, namely an inner zone 154, an annular middle zone 156 and an annular outer zone 158. A multipath lid 160 overlies the orifice plate 150. A hub 170 may overlie the lid 160. As depicted in FIG. 2A through 2E, the hub 170 has three concentric channels 171, 172, 173 in its bottom surface 174. The hub 170 further has three gas supply ports 175, 176, 177 coupled to the gas supply lines 141, 142, 143 respectively, the ports 175, 176, 177 being coupled to respective ones of the concentric channels 171, 172, 173. Each channel 171, 172, 173 receives process gas from a particular one of the supply lines 141, 142, 143. The hub 170 may have a passageway or hole (not shown) extending axially through the hub 170 to enable installation of an optical interferometric sensor for process end-point detection.

Figure 2A:
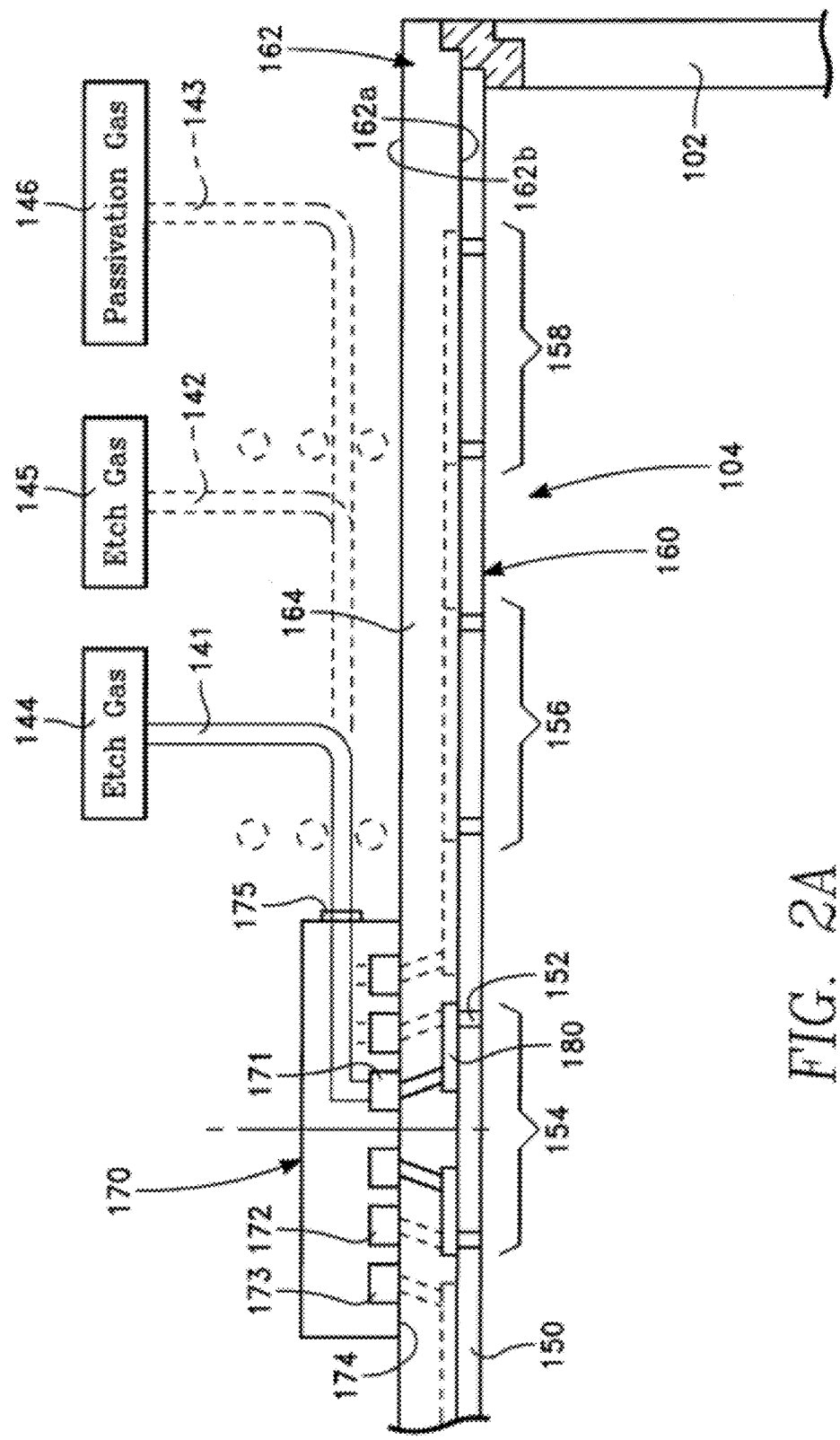
FIGS. 2A, 2B and 2C are different cross-sectional side views of a ceiling of the reactor of FIG. 1 revealing a gas distribution assembly within the ceiling.
Figure 2B:
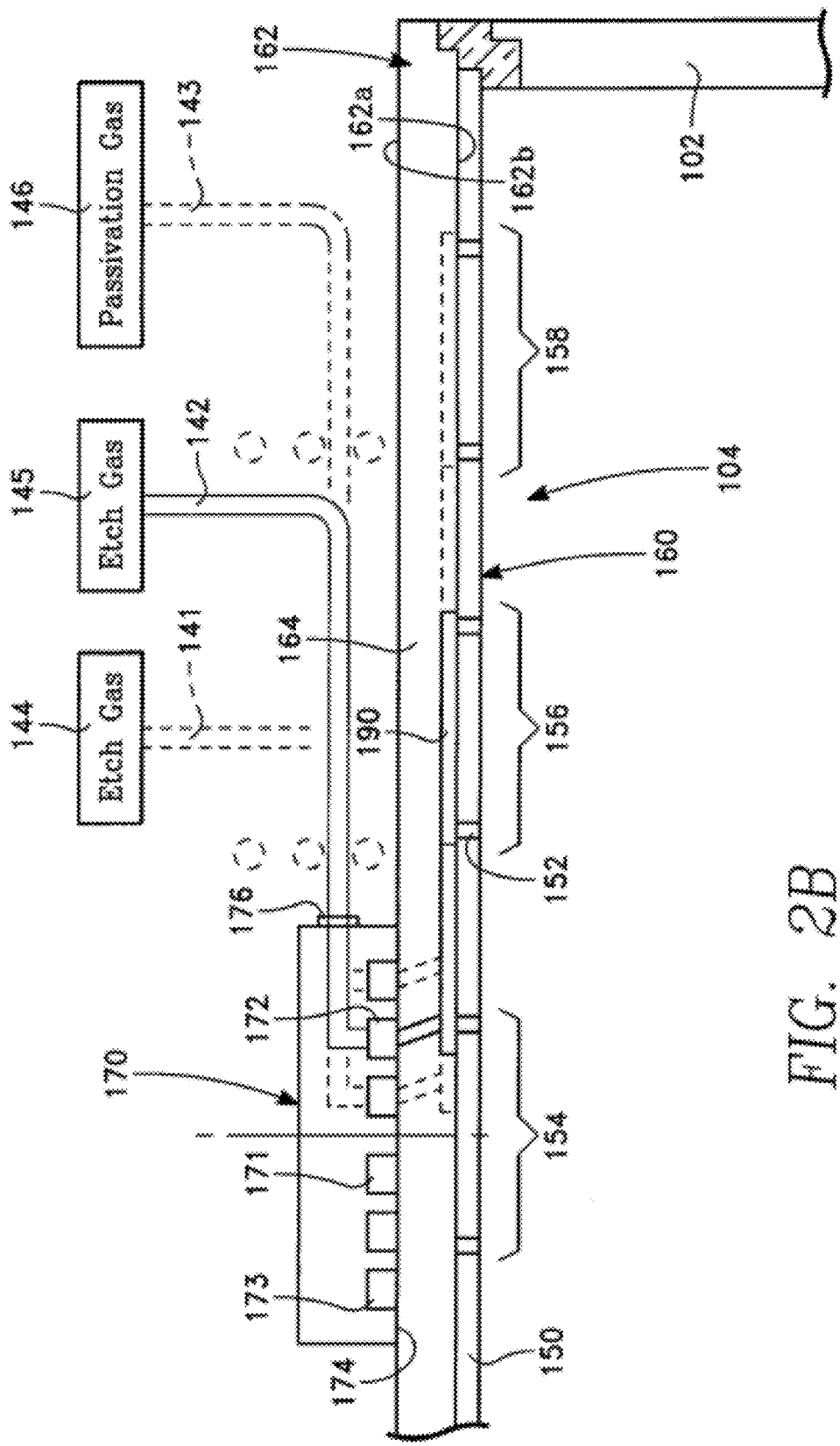
Figure 2C:
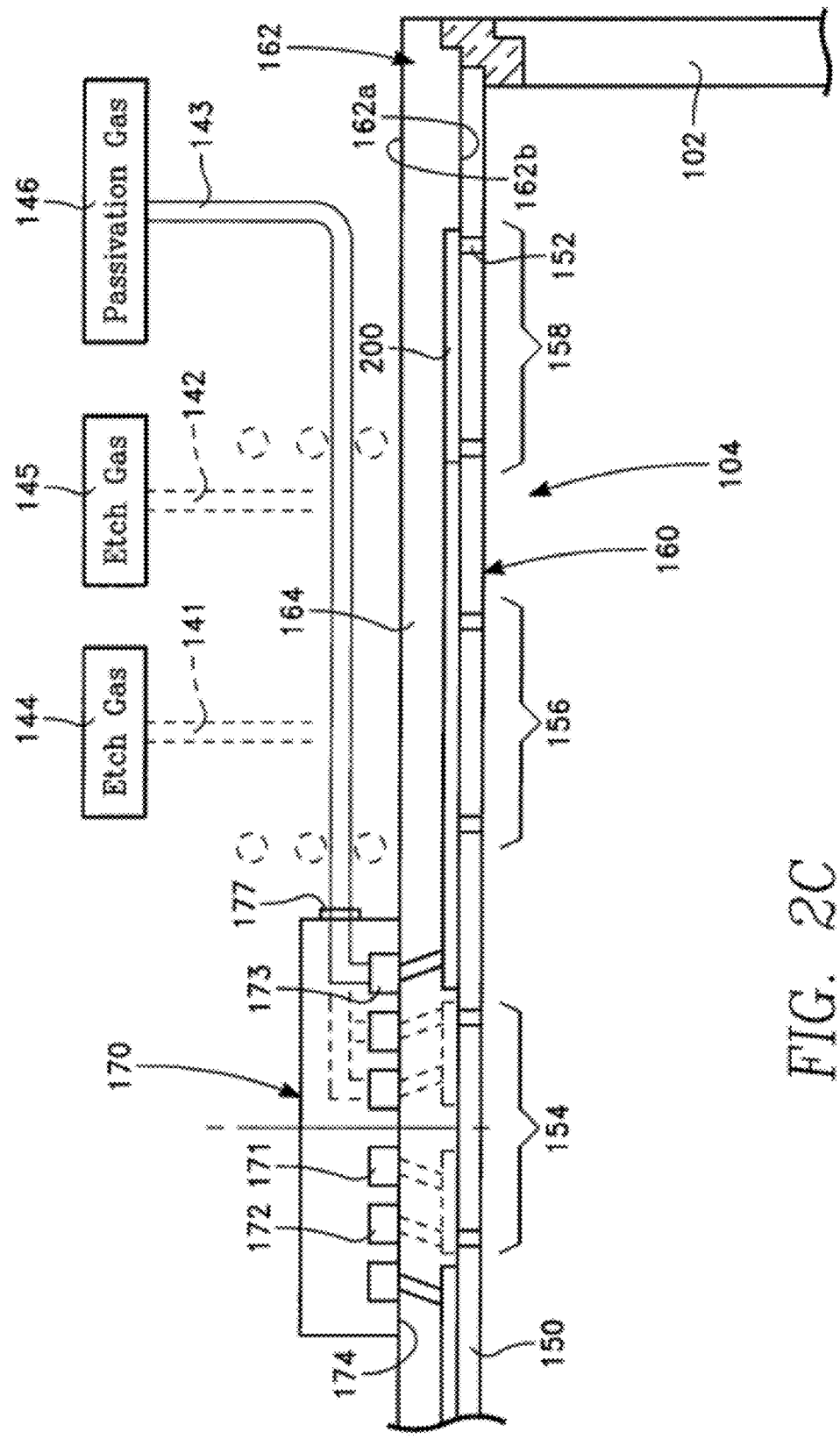
Figure 2D:
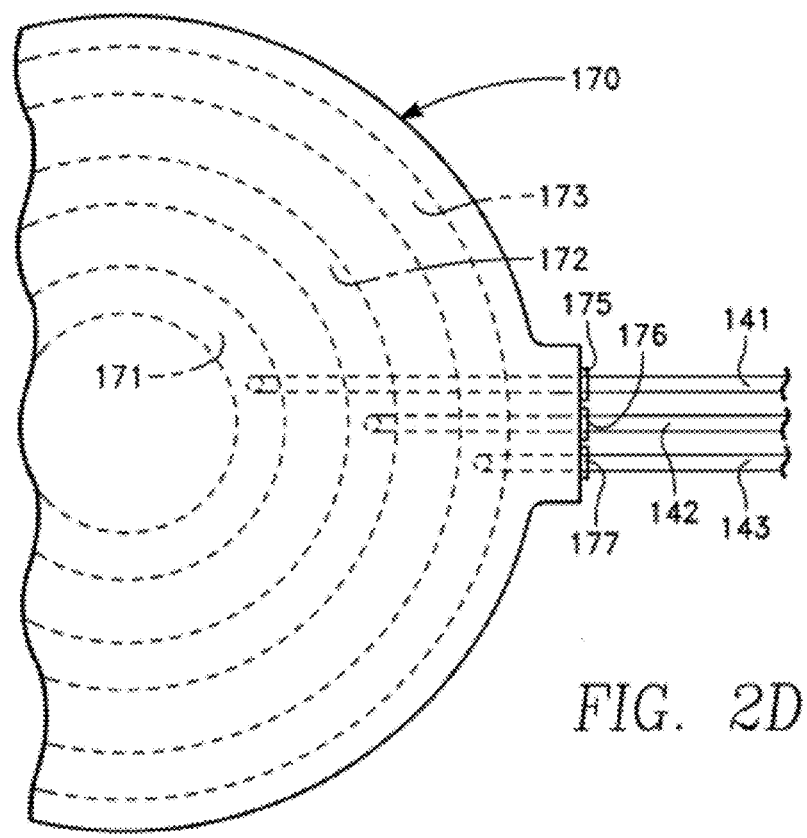
FIG. 2D is a top view of a gas feed hub in the reactor of FIG. 1.
Figure 2E:
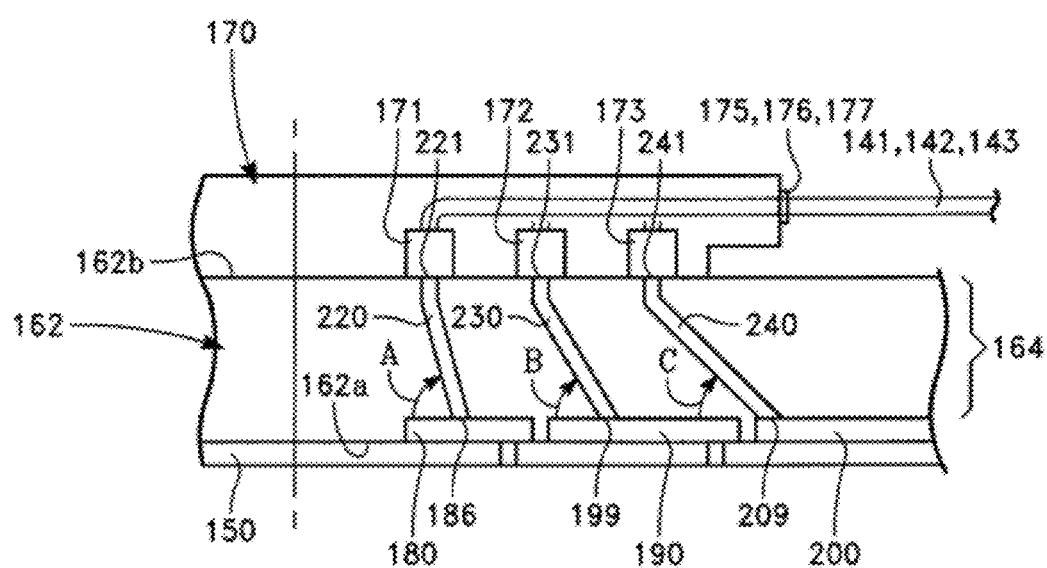
FIG. 2E is an enlarged cross-sectional side view of a portion of the ceiling of the reactor of FIG. 1.

In the illustrated embodiment, the lid 160 consists of an equal path length manifold 162 whose top surface 162b contacts the hub 170. Referring to FIG. 2E, the equal path length manifold 162 has an array of equal path length channels 180, 190, 200 formed in its bottom surface 162a. As shown in FIG. 2E, the equal path length manifold 162 has a radial translation layer 164 overlying the equal path length channels 180, 190, 200. The radial translation layer 164 has radial channels 220, 230, 240 providing communication between individual hub channels 171, 172, 173 and respective ones of the equal path length channels 180, 190, 200, as will be described in greater detail below. The radial translation layer 164 and the equal path length manifold constitute an integral structure. Alternatively, they may be formed as separate pieces that are joined together. The equal path length channels 180, 190, 200 communicate between individual ones of the radial channels 220, 230, 240 and respective ones of the gas injection zones 154, 156, 158. The cross-sectional side views of FIGS. 2A, 2B and 2C are taken at different angles around the axis of symmetry to reveal different internal features. In the view of FIG. 2A, the communication between the inner hub channel 171 and the inner gas injection zone 154 is exposed. In the view of FIG. 2B, the communication between the middle hub channel 172 and the middle gas injection zone 156 is exposed. In the view of FIG. 2C, the communication between the outer hub channel 173 and the outer gas injection zone 158 is exposed.

Figure 3A:
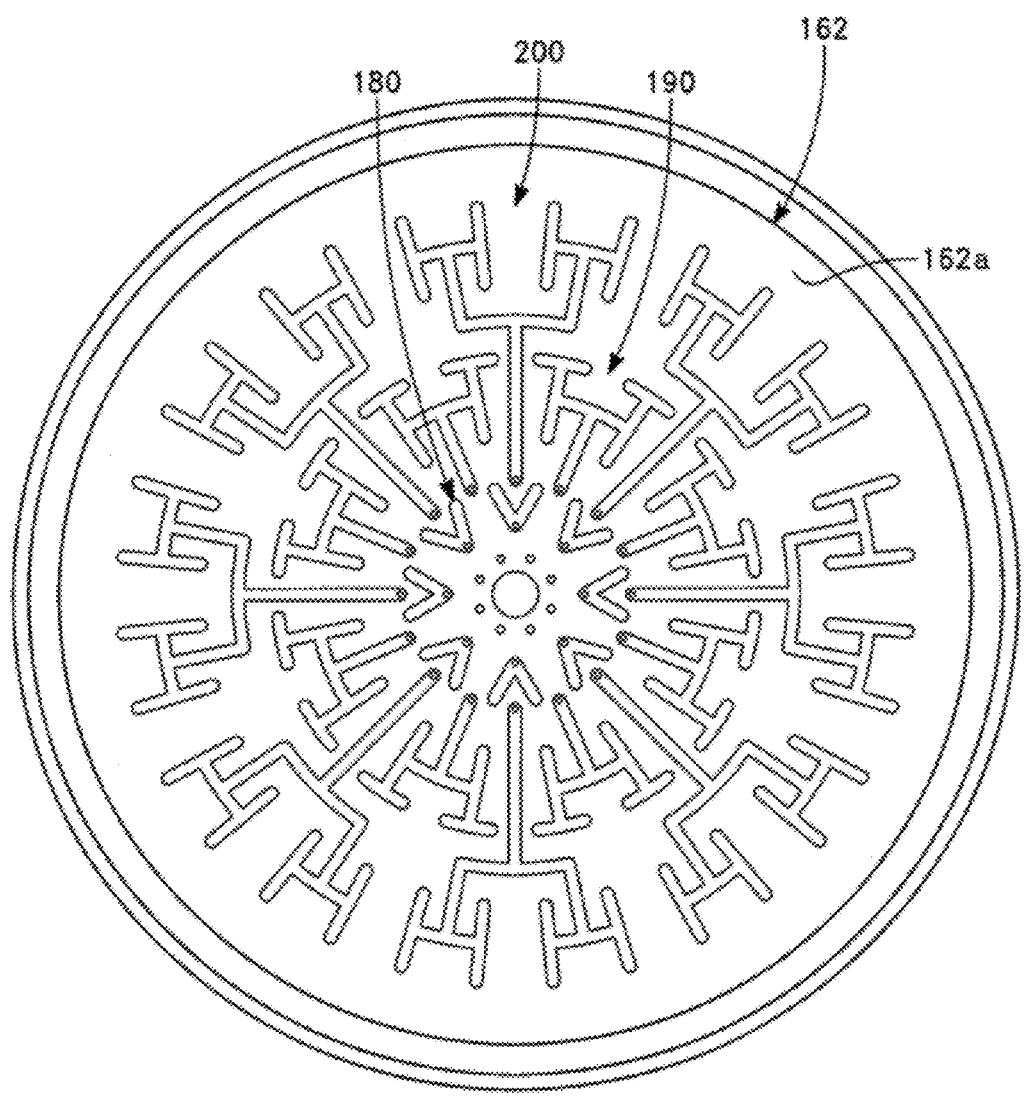
FIG. 3A is a view of the bottom surface of an equal path length manifold in the gas distribution assembly of FIGS. 2A-2C.
Figure 3B:
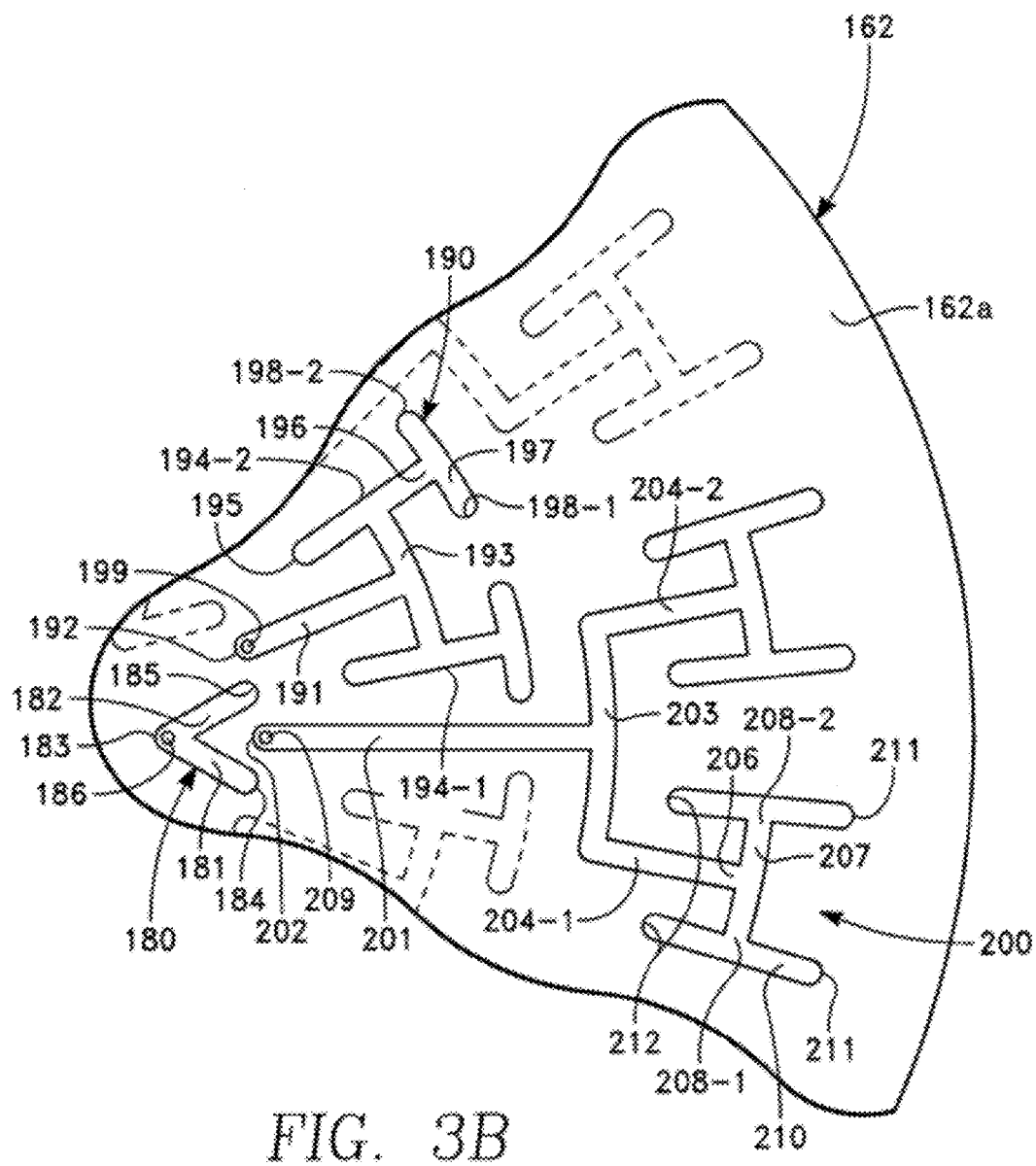
FIG. 3B is an enlarged portion of the view of FIG. 3A.

FIGS. 3A and 3B are top views of equal path length manifold (EPLM) 162 showing the different equal path length channels 180, 190, 200 correspond to three different groups or types of gas flow channels, namely the inner zone channels 180, the middle zone channels 190 and the outer zone channels 200. In the implementation of FIGS. 3A and 3B, there are eight inner zone channels 180, eight middle zone channels 190 and eight outer zone channels 200, the channels of each type being azimuthally distributed in periodic fashion.

Figure 4:
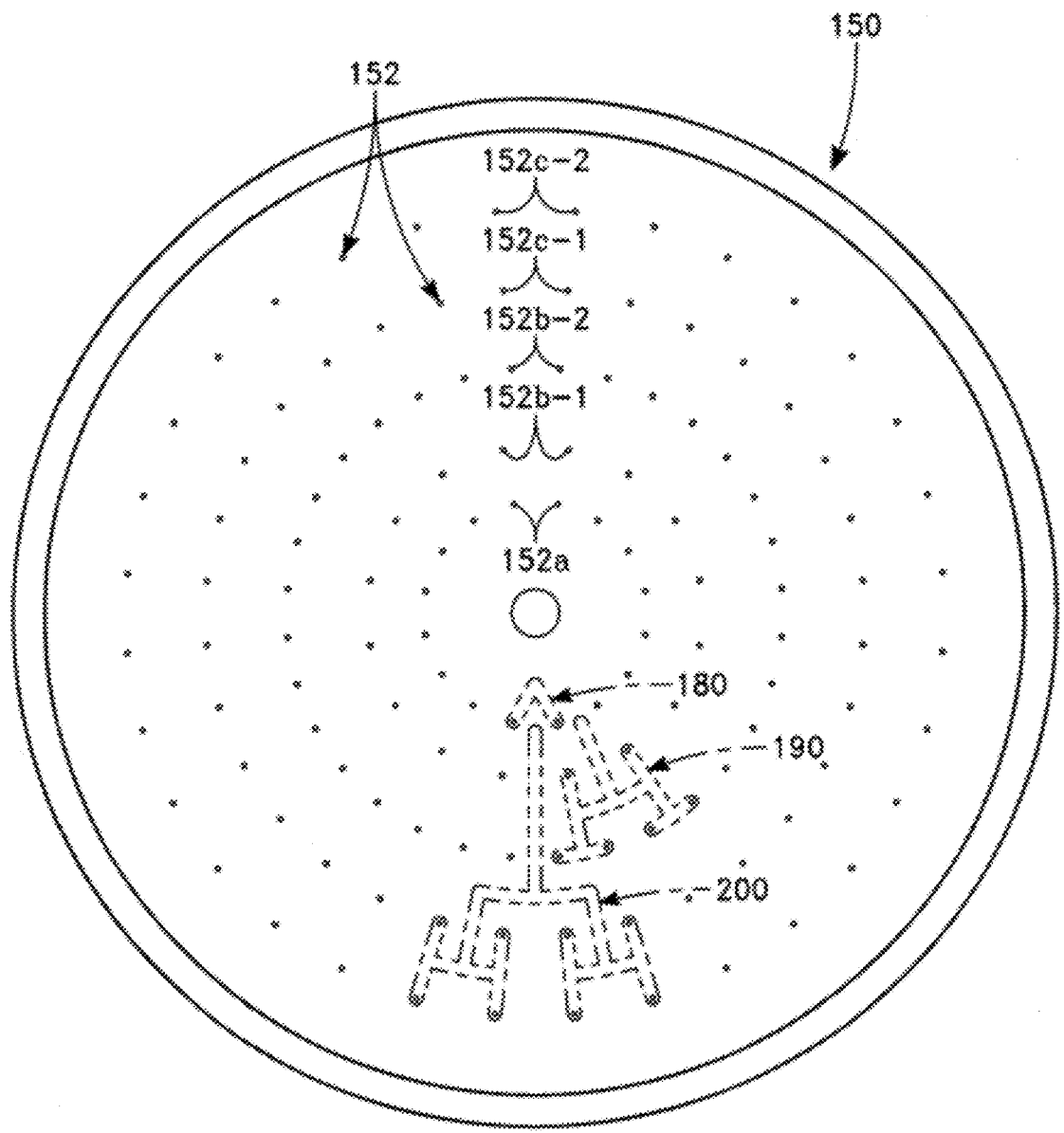
FIG. 4 is a view of the bottom surface of a gas distribution orifice plate in the gas distribution assembly of FIGS. 2A-2C.

FIG. 4 is a bottom view of the gas distribution orifice plate 150 showing how the plural gas injection orifices 152 may be grouped in different circular zones corresponding to the inner, middle and outer zones 154, 156, 158 referred to above, including a set of inner zone orifices 152a, first and second sets of middle zone orifices 152b-1, 152b-2, and first and second sets of outer zone orifices 152c-1, 152c-2. A subset of the overlying equal path length channels 180, 190, 200 is depicted in hidden line in FIG. 4 to show their alignment with the various orifices 152.

In the illustrated embodiment of FIGS. 3B and 4, each of the eight inner zone channels 180 consists of a pair of legs 181, 182 forming an acute angle and joined together at an apex 183 from which the legs 181, 182 radiate toward terminations 184, 185. A gas inlet hole 186 extends from the apex 183 to the opposite (top) surface 162b (FIG. 2E) of the EPLM 162. Each termination 184, 185 is aligned with a corresponding one of the orifices 152*a* of the inner zone 154 of the orifice plate 150. In this manner, each of the orifices 152*a* of the inner zone 154 is aligned with one of the terminations 184, 185 of the eight inner zone channels 180.

Referring again to FIGS. 3B and 4, each of the middle zone channels 190 consists of a radial main leg 191 extending from an apex 192 and terminating in the middle of a transverse leg 193 forming a "T" with the main leg 191, the two ends of the transverse leg 193 terminating in the middle of each of respective radial legs 194-1, 194-2, each of the radial legs 194-1, 194-2 having a radially inward end 195 and a radial outward end 196, each radial leg 194-1, 194-2 terminating in the middle of a transverse leg 197 at its radially outward end 196 to form a "T". Each transverse leg has a pair of opposite ends 198-1, 198-2. A gas inlet hole 199 extends from the apex 192 to the opposite (top) surface 162*b* (FIG. 2A) of the EPLM 162. The first set of orifices 152*b*-1 in the middle zone 156 of the orifice plate 150 face the channel ends 195. The second set of orifices 152*b*-2 of the middle zone 156 face respective ones of the channel ends 198-1, 198-2.

Referring yet again to FIGS. 3B and 4, each of the outer zone channels 200 consists of a radial main leg 201 extending from an apex 202 and terminating in the middle of a transverse leg 203 forming a "T" with the main leg 201, the two ends of the transverse leg 203 terminating in the middle of each of respective radial legs 204-1, 204-2, each of the radial legs 204-1, 204-2 extending radially to a radial outward end 206, each radial leg 204-1, 204-2 terminating in the middle of a transverse leg 207 at its radially outward end 206 to form a "T". Each transverse leg 207 has a pair of opposite ends 208-1, 208-2 terminating in the middle of each of respective radial legs 210. Each radial leg 210 has a pair of opposite termination ends 211, 212. Each outer channel 200 has a total of four channel ends 211 and four channel ends 212. A gas inlet hole 209 extends from the apex 202 to the opposite (top) surface 162*b* (FIG. 2E) of the EPLM 162. The first set of orifices 152*c*-1 in the outer zone 158 of the orifice plate 150 face the channel ends 211. The second set of orifices 152*c*-2 of the outer zone 158 face the channel ends 212.

In accordance with one feature, the array of channels 180, 190, 200 in the bottom surface 162*a* of the EPLM manifold 162 are configured so that the distances traveled within the EPLM 162 by process gas to different orifices within inner zone 154 are uniform. In the illustrated embodiment, the distances traveled within the EPLM 162 by process gas to different orifices 152 within the middle zone 156 are uniform. In this same embodiment, the distances traveled within the EPLM 162 by process gas to different orifices 152 within the outer zone 158 are uniform. Another feature is that the arc distances subtended by the various equal path length channels within the EPLM are all not more than fractions of a circle, which prevents or minimizes inductive coupling to the gases therein.

Referring to FIGS. 2A-2E, the radial translation layer 164 of the EPLM 162 provides the gas communication from the inner, middle and outer concentric channels 171, 172, 173 of the hub 170 to the inner zone, middle zone and outer zone gas inlets 186, 199, 209 of the EPLM 162. Specifically, the radial translation layer 164 provides gas communication between the inner hub channel 171 and the inner zone gas inlets 186 through the radial channels 220, between the middle hub channel 172 and the middle zone gas inlets 199 through the radial channels 230, and between the outer hub channel 173 and the outer zone gas inlets 209 through the radial channels 240.

As shown in FIGS. 2A through 2E, the radial translation layer 164 may have its plural inner zone channels 220 tilted at a first acute angle A relative to the axis of symmetry. Each inner zone axial channel 220 has a first end 221 open at the top surface 162*b* and facing the inner concentric hub channel 171. Each inner zone axial channel 220 further has a second end in registration with one of the inner zone gas inlets 186 of the EPLM 162. In this manner, eight inner zone axial channels 220 provide gas flow from the inner hub channel 171 to the eight inner zone gas inlets 186 of the EPLM 162.

The radial translation layer 164 may have its plural middle zone axial channels 230 tilted at a second acute angle B relative to the axis of symmetry. In the illustrated embodiment, each middle zone axial channel 230 may have a first end 231 open at the top surface 162*b* and facing the middle concentric hub channel 172. Each middle zone axial channel 230 further may have a second end in registration with one of the middle zone gas inlets 199 of the EPLM 162. In this manner, eight middle zone axial channels 230 may provide gas flow from the middle hub channel 172 to the eight middle zone gas inlets 199 of the EPLM 162.

The radial translation layer 164 may have its plural outer zone axial channels 240 tilted at a third acute angle C relative to the axis of symmetry. Each outer zone axial channel 240 has a first end 241 open at the top surface 162*b* and facing the outer concentric hub channel 173. Each outer zone axial channel 240 further may have a second end in registration with one of the outer zone gas inlets 209 of the EPLM 162. In this manner, eight outer zone axial channels 240 may provide gas flow from the outer hub channel 173 to the eight outer zone gas inlets 209 of the EPLM 162.

The first, second and third acute angles A, B, C may be progressively smaller to accommodate the different radial locations of the inner zone gas inlets 186, the middle zone gas inlets 199 and the outer zone gas inlets 209. In the implementation of FIGS. 1-3, the radial distance of the middle and outer zone gas inlets 199, 209, from the axis of symmetry are the same so that the second and third acute angles B and C are nearly the same. The middle and outer zone gas inlets 199, 209 have different azimuthal locations in alternating sequence, as shown in the drawings.

Figure 5:
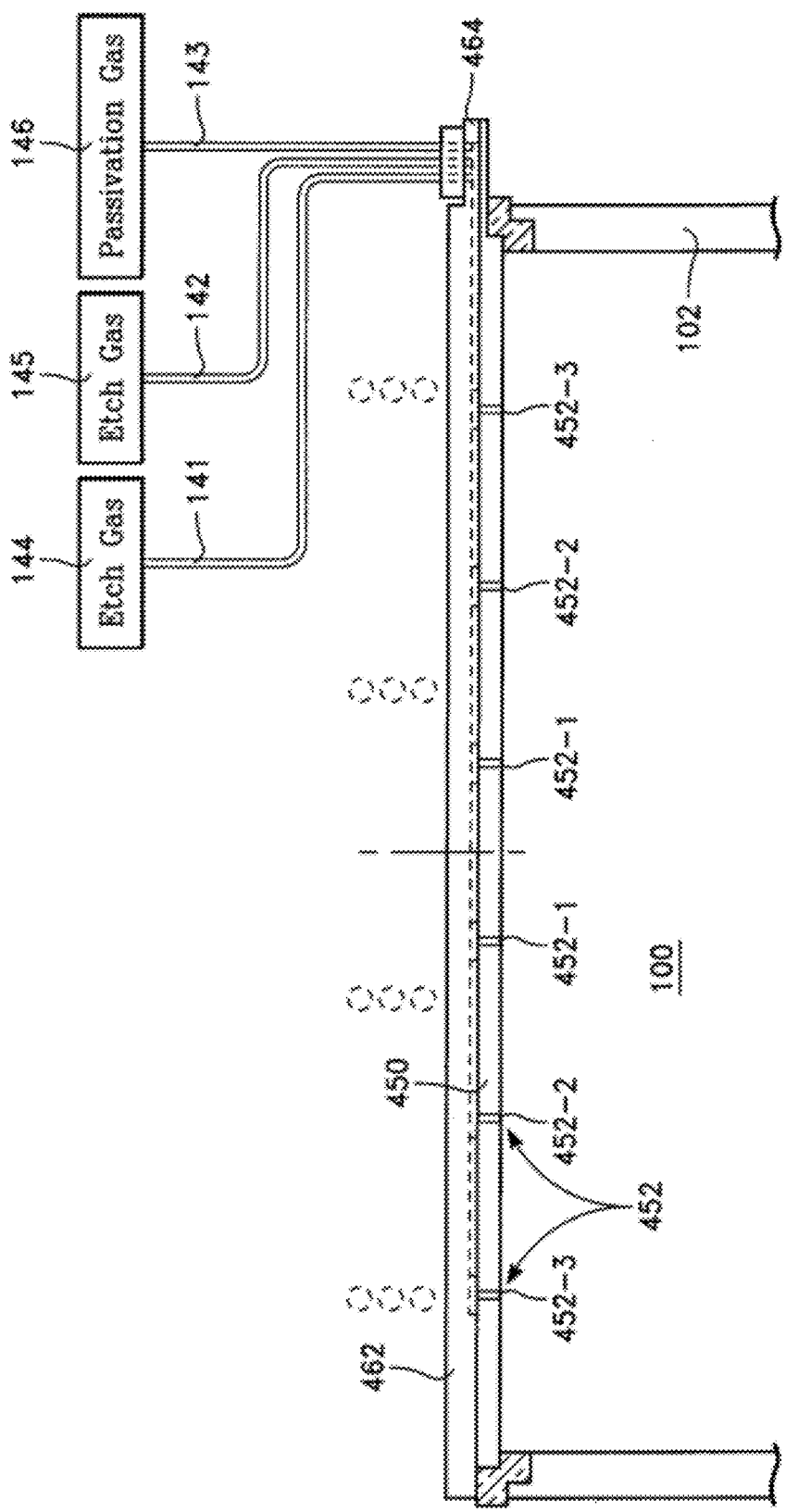
FIG. 5 depicts a plasma reactor in accordance with a second embodiment including a gas distribution assembly in the ceiling of the reactor.
Figure 6:
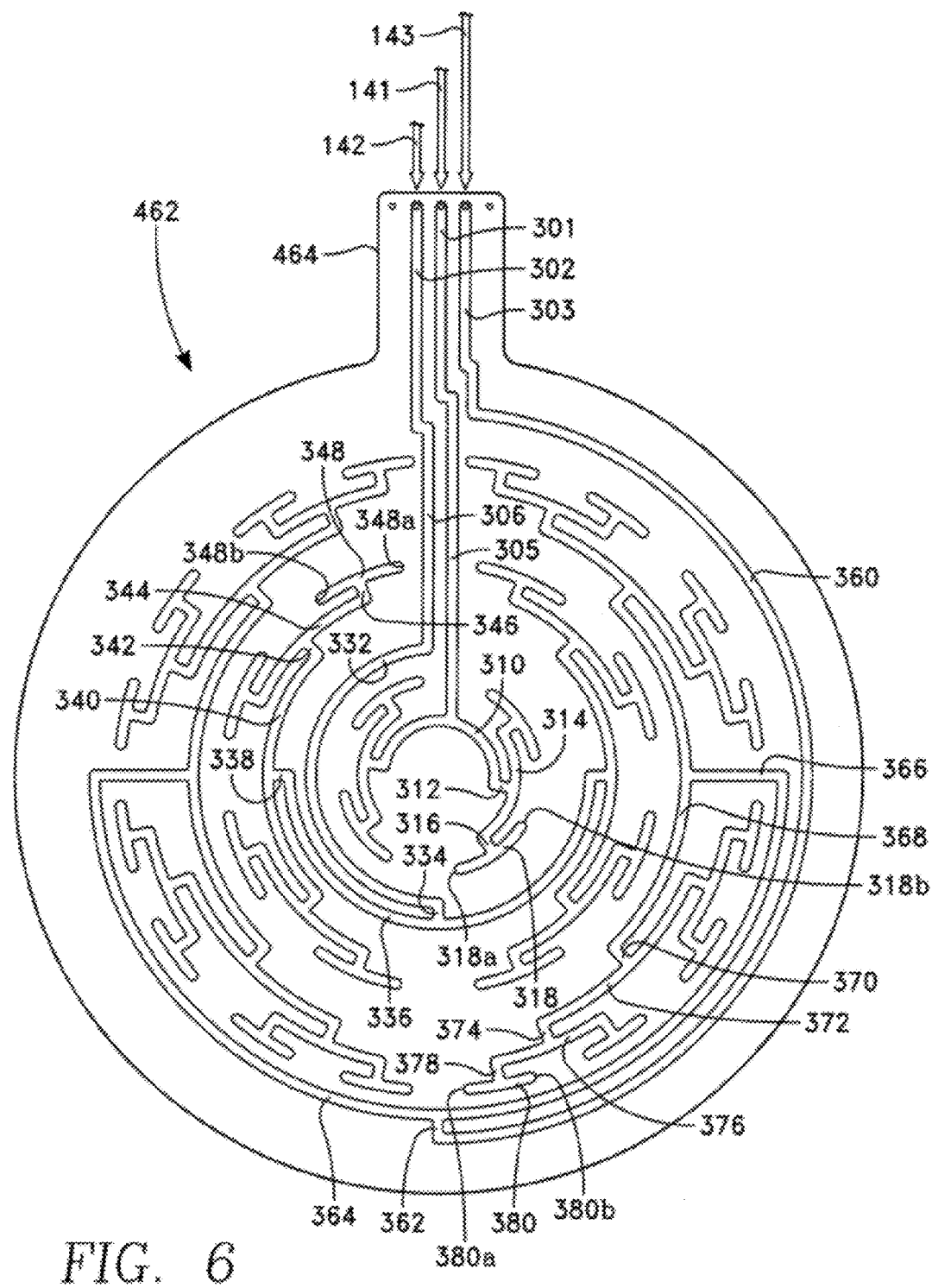
FIG. 6 is a view of the bottom surface of an equal path length manifold in the gas distribution assembly of FIG. 5.

FIGS. 5 and 6 depict another embodiment employing an EPLM manifold 462 and an orifice plate 450. In FIG. 5, the three gas supply lines 141, 142, 143 are coupled directly to the EPLM manifold 462. An advantage of the embodiment of FIGS. 5 and 6 is that the hub 170 and radial translation layer 164 of FIG. 1 are eliminated.

In the illustrated embodiment of FIGS. 5 and 6, the bottom surface of the EPLM 462 has gas distribution channels including inner, middle and outer zone gas input channels 301, 302, 303 coupled to the gas supply lines 141, 142, 143, respectively. The gas input channels 301, 302, 303 may be formed in a radial extension 464 of the circular EPLM 462. Gas connections (not shown) are provided at the outer terminations of the channels between the gas supply lines 141, 142, 143 and respective ones of the input channels 301, 302, 303.

Figure 7:
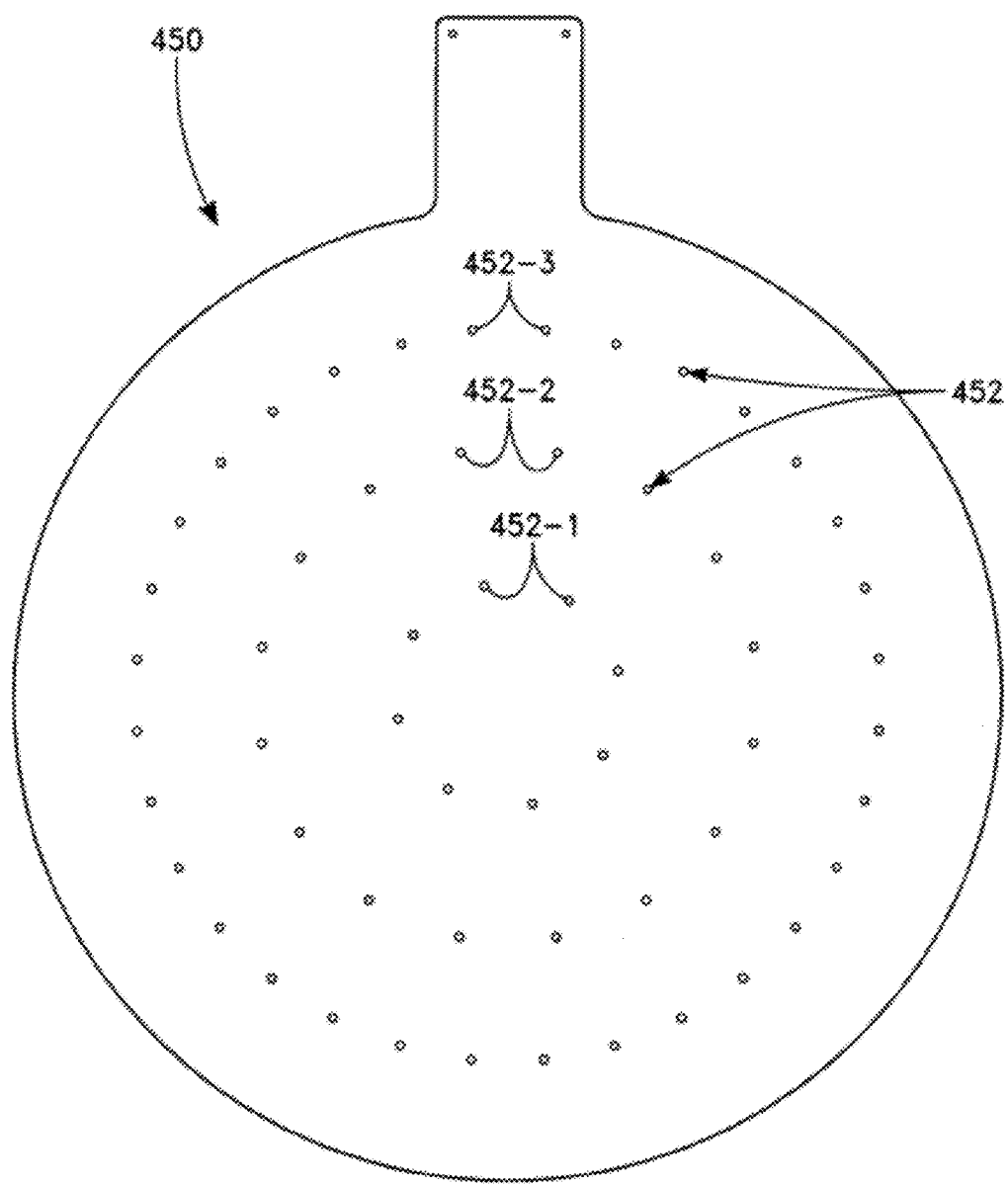
FIG. 7 is a bottom view of a gas distribution orifice plate in the gas distribution assembly of FIG. 6.

In the illustrated embodiment of FIGS. 5 and 6, the inner zone input channel 301 in the extension 464 merges with a radial supply channel 305 within the main circular portion of the manifold 462. The radially inward termination of the supply channel 305 is coupled to the middle of a half-circular channel 310. The opposite ends of the half-circular channel 310 are coupled to the middle of a respective quarter-circular channel 314 through respective radial short transition channels 312. Each of the opposite ends or terminations of the quarter-circular channels 314 is coupled through a respective short radial transition channel 316 to the middle of a respective arcuate channel 318 having opposite first and second ends or terminations 318a, 318b. The terminations 318a, 318b may have a common radial location as shown in FIG. 6, and are aligned with respective ones of a set of inner zone orifices 452-1 of the orifice plate 450 shown in FIG. 7.

In the illustrated embodiment of FIGS. 5 and 6, the middle zone input channel 302 in the extension 464 merges with a radial supply channel 306 within the main circular portion of the manifold 462. The radially inward termination of the supply channel 306 is coupled to one end of a half-circular channel 332. The opposite end of the half-circular channel 332 is coupled through a short radial transition channel 334 to the middle of a half-circular channel 336. The opposite ends of the half-circular channel 336 are each coupled through a respective short radial transition channel 338 to the middle of a respective quarter-circular channel 340. Each of the opposite ends or terminations of the quarter-circular channels 340 is coupled through a respective short radial transition channel 342 to the middle of a respective arcuate channel 344. Each of the opposing ends or terminations of the arcuate channels 344 is coupled through a respective short radial transition channel 346 to the middle of a respective arcuate channel 348 having opposite first and second ends or terminations 348a, 348b. The terminations 348a, 348b may have a common radial location as shown in FIG. 6, and are aligned with respective ones of a set of middle zone orifices 452-2 of the orifice plate 450 shown in FIG. 7.

In the illustrated embodiment of FIGS. 5 and 6, the outer zone input channel 303 in the extension 464 merges with one end of an outer half-circular supply channel 360 within the main circular portion of the manifold 462. The opposite end or termination of the outer supply channel 360 is coupled radially inwardly through a short radial transition channel 362 to the middle of an inner half-circular channel 364 concentric with and inside the radius of the outer supply channel 360. Each one of the opposite ends of the half-circular channel 364 is coupled radially inwardly through a respective short radial transition channel 366 to the middle of a respective quarter-circular channel 368. The quarter-circular channel 368 is encircled by the half-circular channel 364. Each opposite end of each quarter-circular channel 368 is coupled through a respective short radial transition channel 370 to the middle of a respective arcuate channel 372. Each of the opposite ends or terminations of the arcuate channels 372 is coupled through a respective short radial transition channel 374 to the middle of a respective arcuate channel 376. Each of the opposing ends or terminations of the arcuate channels 376 is coupled through a respective short radial transition channel 378 to the middle of a respective arcuate channel 380 having opposite first and second ends or terminations 380a, 380b. The terminations 380a, 380b may have a common radial location as shown in FIG. 6, and are aligned with respective ones of a set of outer zone orifices 452-3 of the orifice plate 450 shown in FIG. 7.

Figure 8A:
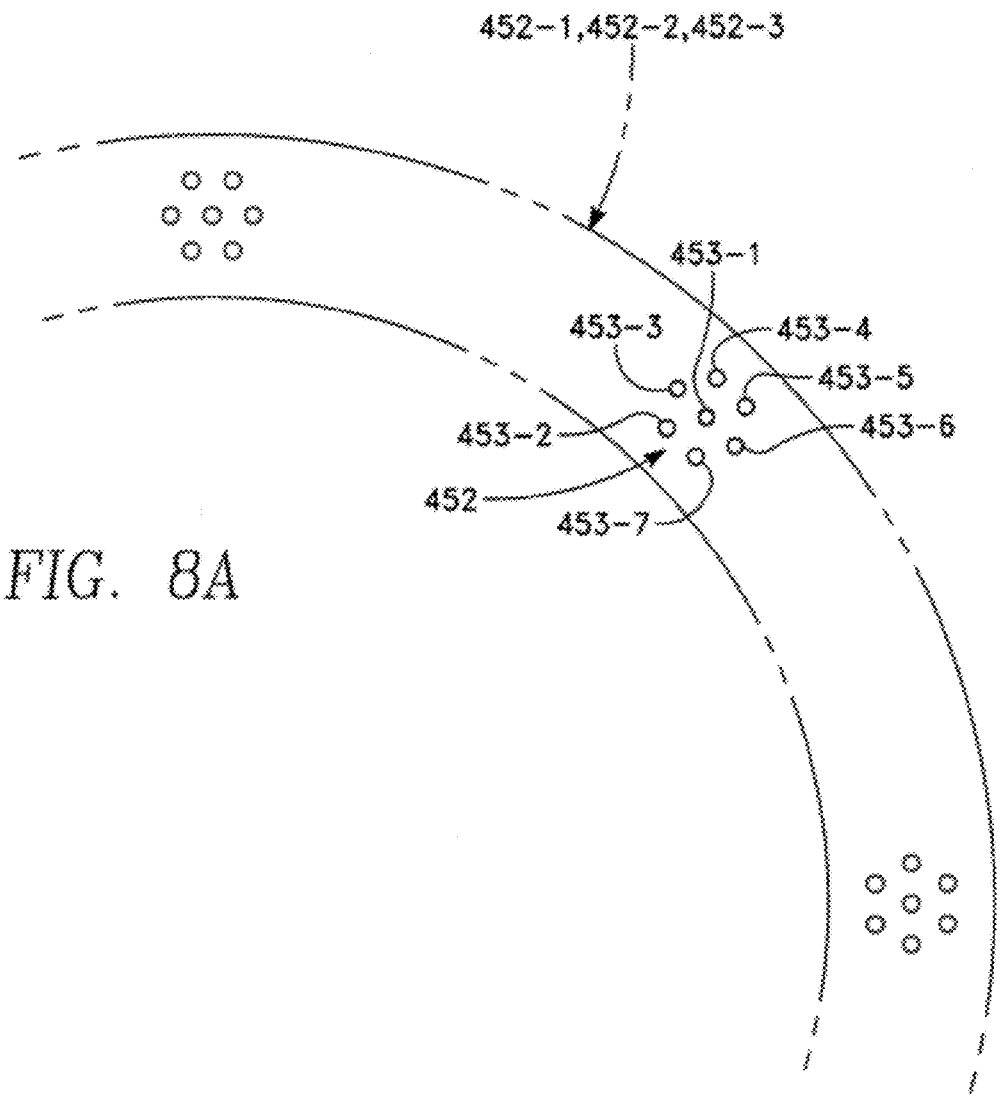
FIG. 8A is an enlarged view of FIG. 7, illustrating an embodiment in which each individual orifice of FIG. 7 consists of seven miniature orifices.
Figure 8B:
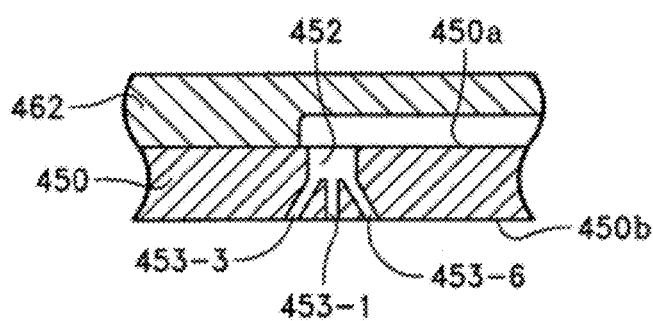
FIG. 8B is a cross-sectional view corresponding to FIG. 8A.

Referring to FIGS. 8A and 8B, each of the orifices 452 in one embodiment may form a single hole or opening in the top surface 450a of the orifice plate, but branch radially outwardly into seven smaller holes 453-1, 453-2, 453-3, 453-4, 453-5, 453-6 and 453-7 in the bottom surface 450b of the orifice plate. FIG. 8A depicts this feature in the group of inner zone orifices 452-1.

Figure 9:
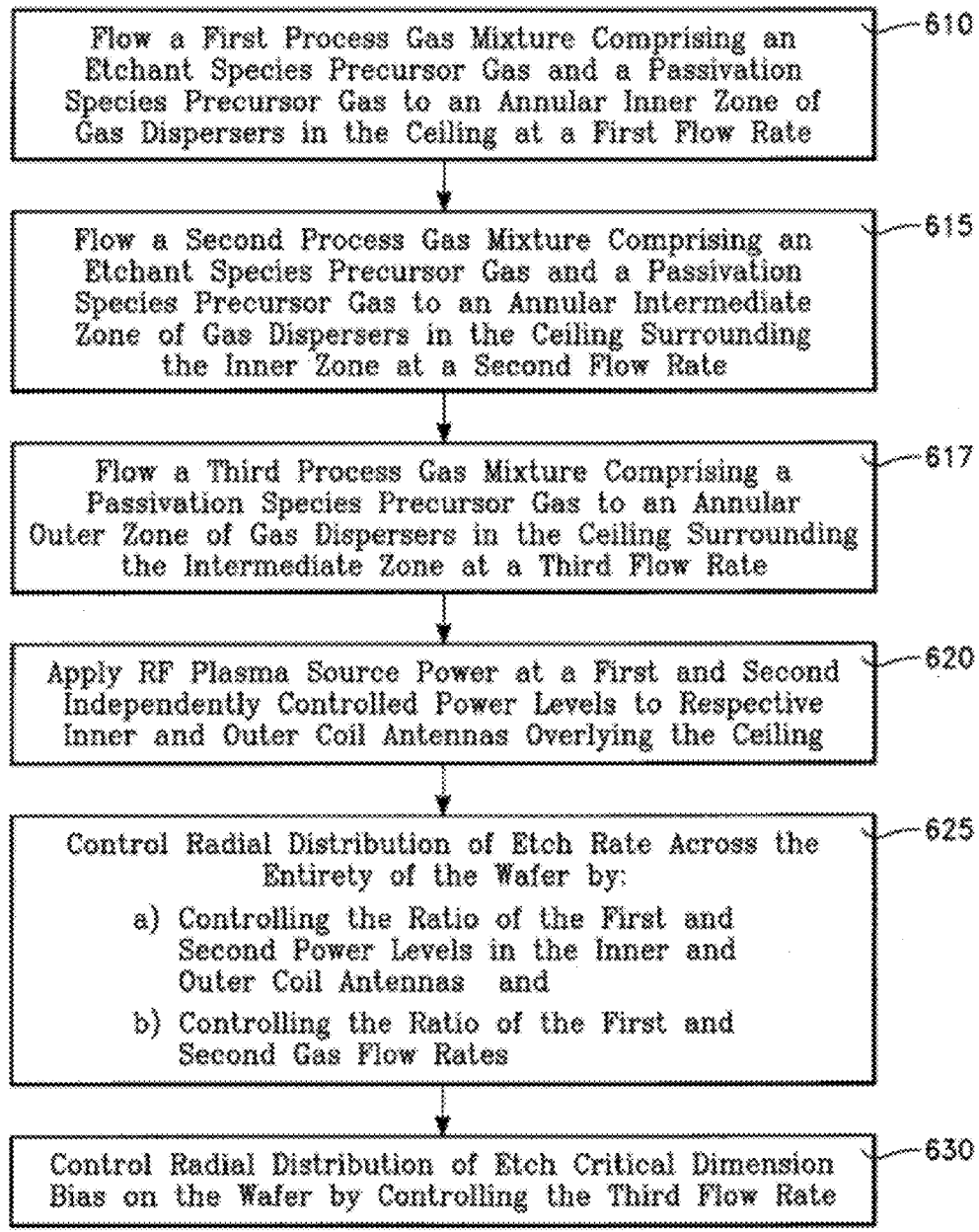
FIG. 9 is a flow diagram depicting a hard mask etch process in accordance with one embodiment.

FIG. 9 is a flow diagram depicting a process in accordance with one embodiment that can be carried out in the reactor of FIG. 1 (or in the reactor of FIG. 5). The process of FIG. 9 begins by flowing a first process gas mixture of an etchant species precursor gas and a passivation species precursor gas to an annular inner zone of gas dispersers in the ceiling at a first flow rate (block 610 of FIG. 9). The process includes flowing a second process gas mixture of an etchant species precursor gas and a passivation species precursor gas to an annular middle zone of gas dispersers in the ceiling surrounding the inner zone at a second flow rate (block 615). The process further includes flowing a process gas which is a pure or nearly pure passivation species precursor gas to an annular outer zone of gas dispersers in the ceiling surrounding the middle zone at a third flow rate (block 617). RF plasma source power is applied at first and second independently controlled power levels to respective inner and outer coil antennas overlying the ceiling (block 620). The radial distribution of etch rate across the entirety of the wafer is obtained by controlling the ratio of the first and second power levels in the inner and outer coil antennas and (or, alternatively) by controlling the ratio of the inner and outer zone (first and second) gas flow rates (block 625). Uniformity of the radial distribution of either etch critical dimension (CD) bias or etch profile taper is controlled by controlling the third flow rate, i.e., the flow rate of the passivation species precursor gas to the third gas injection zone (block 630).

The process may be applied to etching a silicon nitride or silicon oxide hard mask prior to a gate etch step. In this case the etchant species precursor may be $CF_4$ and the passivation species precursor may be $CHF_3$. In general, the etchant species precursor gas is a fluorocarbon (i.e., a species containing no hydrogen) while the passivation species precursor gas is a fluoro-hydrocarbon (i.e., a species containing a significant proportion of hydrogen). More generally, the etchant species precursor gas contains a high proportion of fluorine and a low proportion (less than a few percent atomic ratio) or zero amount of hydrogen, while a significant fraction (20% atomic ratio) of the passivation species is hydrogen. The gas mixtures flowed to the inner and middle zones may be identical, while their flow rates are different and independently controlled.

The etch critical dimension (CD) bias and the etch profile taper tend to be less at the wafer edge. In order to improve uniformity of radial distribution of either or both the CD bias and the etch profile tapering, the third gas flow rate (the flow rate of the pure passivation species precursor gas to the outer zone of gas dispersers) is increased until the nonuniformity in distribution of CD bias or profile taper has been minimized. An overcorrection that raises the CD bias or etch profile taper at the wafer edge above the average value across the wafer requires a corresponding reduction in the pure passivation species precursor gas in outer zone of gas dispersers.

While the foregoing is directed to embodiments of the present invention, other and further embodiments of the invention may be devised without departing from the basic scope thereof, and the scope thereof is determined by the claims that follow.

What is claimed is:

1. A ceiling gas distribution assembly for use in a plasma reactor for processing a semiconductor substrate, comprising:
    a planar gas injection orifice plate comprising concentric inner, intermediate and outer annular zones of gas injection orifices;
    a central gas receiving hub overlying said orifice plate, said hub comprising three gas supply ports and having a hub bottom surface and three concentric hub channels formed in said hub bottom surface and internally coupled to respective ones of said three gas supply ports;
    a translation gas manifold underlying said hub and comprising three sets of internal gas flow channels associated with said inner, intermediate and outer zones, respectively, each of said internal gas flow channels comprising: (a) a gas input opening at a top surface of said translation gas manifold in registration with a respective one of said concentric hub channels and (b) a gas output opening at a bottom surface of said translation gas manifold at a radius corresponding to a respective one of said inner, intermediate and outer zones;

an equal path length (EPL) manifold between said translation gas manifold and said orifice plate and providing gas flow paths of equal path lengths from the gas output openings of individual ones of said zones to the gas injection orifices of the same zones;

wherein said gas flow paths of equal path lengths comprise a hierarchy of radial channels and a hierarchy of circumferential channels, said radial channels coupling between successive circumferential channels;

and wherein circumferential channels are configured as arcs corresponding to fractions of circles.

2. The apparatus of claim 1 wherein said central hub has a diameter corresponding to a fraction of the diameter of said orifice plate.

3. The apparatus of claim 1 wherein said gas flow paths of said EPL manifold comprise inner, intermediate and outer arrays of channels, each of said array of channels comprising a channel input end and plural channel output ends, each said array of channels radiating from said channel input end to said plural channel output ends in paths of equal lengths.

4. The apparatus of claim 3 further comprising respective passages through said orifice plate providing communication between respective ones of said gas output openings of said translation manifold and respective ones of said channel input ends of said EPL manifold.

5. The apparatus of claim 4 wherein said plural channel output ends of respective ones of said inner, intermediate and outer arrays of channels are in registration with individual orifices of the respective ones of said inner, intermediate and outer zones of said orifice plate.

6. The apparatus of claim 5 wherein said internal channels of said translation manifold each span a radial distance corresponding to a difference between radial locations of respective ones of said concentric hub channels and respective ones of said input ends of said channels of said EPL manifold.

7. A plasma reactor, comprising:
a chamber defined by a cylindrical side wall;
a workpiece support pedestal within said chamber;
a ceiling gas distribution assembly overlying said workpiece support pedestal and comprising:
a planar gas injection orifice plate comprising concentric inner, intermediate and outer annular zones of gas injection orifices;
a central gas receiving hub overlying said orifice plate, said hub comprising three gas supply ports and having a hub bottom surface and three concentric hub channels formed in said hub bottom surface and internally coupled to respective ones of said three gas supply ports;
a translation gas manifold underlying said hub and comprising three sets of internal gas flow channels associated with said inner, intermediate and outer zones, respectively, each of said internal gas flow channels comprising: (a) a gas input opening at a top surface of said translation gas manifold in registration with a respective one of said concentric hub channels and (b) a gas output opening at a bottom surface of said translation gas manifold at a radius corresponding to a respective one of said inner, intermediate and outer zones;
an equal path length (EPL) manifold between said translation gas manifold and said orifice plate and providing gas flow paths of equal path lengths from the gas output openings of individual ones of said zones to the gas injection orifices of the same zones;
wherein said gas flow paths of equal path lengths comprise a hierarchy of radial channels and a hierarchy of circumferential channels, said radial channels coupling between successive circumferential channels;
and wherein circumferential channels are configured as arcs corresponding to fractions of circles.

8. The apparatus of claim 7 wherein said central hub has a diameter corresponding to a fraction of the diameter of said orifice plate.

9. The apparatus of claim 7 wherein said gas flow paths of said EPL manifold comprise inner, intermediate and outer arrays of channels, each of said array of channels comprising a channel input end and plural channel output ends, each said array of channels radiating from said channel input end to said plural channel output ends in paths of equal lengths.

* * * * *